(12) United States Patent
Shen et al.

(10) Patent No.: US 8,723,047 B2
(45) Date of Patent: May 13, 2014

(54) PRINTED CIRCUIT BOARD, DESIGN METHOD THEREOF AND MAINBOARD OF TERMINAL PRODUCT

(75) Inventors: Xiaolan Shen, Shenzhen (CN);
Qingsong Ye, Shenzhen (CN);
Konggang Wei, Shenzhen (CN)

(73) Assignee: Huawei Technologies Co., Ltd. (CN)

( * ) Notice: Subject to any disclaimer, the term of this patent is extended or adjusted under 35 U.S.C. 154(b) by 227 days.

(21) Appl. No.: 12/053,142

(22) Filed: Mar. 21, 2008

(65) Prior Publication Data

US 2008/0230258 A1    Sep. 25, 2008

(30) Foreign Application Priority Data

Mar. 23, 2007  (CN) .......................... 2007 1 0090909
Jun. 28, 2007  (CN) .......................... 2007 1 0127769

(51) Int. Cl.
*H05K 1/09*  (2006.01)

(52) U.S. Cl.
USPC ........... 174/251; 361/794; 361/799; 361/800; 174/262; 174/263; 174/264

(58) Field of Classification Search
USPC ................................. 174/251, 262, 263, 264
See application file for complete search history.

(56) References Cited

U.S. PATENT DOCUMENTS

| 4,658,334 | A |   | 4/1987  | McSparran et al. |
|-----------|---|---|---------|------------------|
| 4,801,489 | A |   | 1/1989  | Nakagawa et al.  |
| 4,904,968 | A | * | 2/1990  | Theus .......................... 333/246 |
| 5,334,800 | A |   | 8/1994  | Kenney           |
| 5,408,053 | A | * | 4/1995  | Young ........................... 174/264 |
| 5,451,721 | A | * | 9/1995  | Tsukada et al. ............... 174/261 |
| 5,452,291 | A | * | 9/1995  | Eisenhandler et al. ....... 370/402 |
| 5,828,555 | A | * | 10/1998 | Itoh ................................ 361/784 |
| 6,103,977 | A |   | 8/2000  | Namgung          |

(Continued)

FOREIGN PATENT DOCUMENTS

CN    201063970 Y    5/2008
JP    H04296095 A    10/1992

(Continued)

OTHER PUBLICATIONS

"IPC-2222 Sectional Design Standard for Rigid Organic Printed Boards," The Institute for Interconnecting and Packaging Electronic Circuits, Feb. 1998, Northbrook, Illinois.

(Continued)

*Primary Examiner* — Tuan T Dinh
*Assistant Examiner* — Steven T Sawyer
(74) *Attorney, Agent, or Firm* — Huawei Technologies Co., Ltd.

(57) ABSTRACT

A printed circuit board and a design method thereof are disclosed. The design method includes: wiring signal lines on an area basis at inner layers adjacent to outer surface layers; arranging the outer surface layers with no wiring or few wirings and interconnecting the outer surface layers by way of through vias, so that the outer surface layers function as a primary ground; and setting parameters of a line width and a layer height to control a target impedance value. The printed circuit board includes outer surface layers and two inner layers therebetween. The inner layers adjacent to the outer surface layers are used for arranging signal lines on an area basis; and the outer surface layers are arranged with no wiring or few wirings and are interconnected as a primary ground through vias. The invention also discloses a mainboard of a terminal product using the printed circuit board.

3 Claims, 10 Drawing Sheets

(56) References Cited

U.S. PATENT DOCUMENTS

| | | | |
|---|---|---|---|
| 6,202,008 B1* | 3/2001 | Beckert et al. | 701/33 |
| 6,384,340 B1* | 5/2002 | Cheng | 174/255 |
| 6,437,991 B1 | 8/2002 | Rog et al. | |
| 6,614,325 B1* | 9/2003 | Kocin | 333/12 |
| 2002/0032042 A1* | 3/2002 | Poplawsky et al. | 455/564 |
| 2003/0008680 A1* | 1/2003 | Huh et al. | 455/557 |
| 2004/0182265 A1 | 9/2004 | Saiki et al. | |
| 2004/0229396 A1* | 11/2004 | Shi et al. | 438/106 |
| 2005/0039950 A1* | 2/2005 | Chan et al. | 174/262 |
| 2005/0166079 A1* | 7/2005 | Lienhart et al. | 713/500 |
| 2005/0225955 A1* | 10/2005 | Grebenkemper et al. | 361/780 |
| 2006/0017529 A1* | 1/2006 | Cooper et al. | 333/238 |
| 2006/0137905 A1* | 6/2006 | Kariya et al. | 174/255 |
| 2006/0231289 A1* | 10/2006 | Chen et al. | 174/255 |
| 2008/0000681 A1* | 1/2008 | Nakamura | 174/262 |
| 2009/0032285 A1 | 2/2009 | Ueda et al. | |

FOREIGN PATENT DOCUMENTS

| | | | |
|---|---|---|---|
| JP | 10173983 A | 6/1998 | |
| JP | 11-068316 A | 3/1999 | |
| JP | 2001189559 A | 7/2001 | |
| JP | 2002111214 A | 4/2002 | |
| JP | 2002261455 A | 9/2002 | |
| JP | 2004152935 A | 5/2004 | |
| JP | 2004282033 A1 | 10/2004 | |
| JP | 2005142849 A | 6/2005 | |
| JP | 2005-347292 A | 12/2005 | |
| JP | 2004259894 A | 12/2005 | |
| JP | 2006025397 A | 1/2006 | |
| JP | 2006-073555 A | 3/2006 | |
| JP | 2006-297628 A | 11/2006 | |
| JP | 2006324444 A | 11/2006 | |
| JP | 2007027152 A | 2/2007 | |
| KR | 10-2005-0081428 | 8/2005 | |
| WO | 2006080073 A1 | 8/2006 | |

OTHER PUBLICATIONS

Japanese Office Action from corresponding Japanese Patent Application No. 2008-075278, from the Japanese Patent Office dated Jun. 15, 2010.
Korean Office Action from corresponding Korean Patent Application No. 10-2008-0027124, from the Korean Patent Office dated Jan. 25, 2010.
"IPC-2222 Sectional Design Standard for Rigid Organic Printed Boards," The Institute for Interconnecting and Packaging Electronic Circuits, Feb. 1998, Northbrook, Illinois (previously submitted in-part in an IDS on Aug. 24, 2010).
Communication in counterpart European Application No. 08153217.8-2214, mailed May 13, 2009.
Extended European Search Report in counterpart European Application No. 08153217.8-2214, mailed Sep. 10, 2008.
Notice of Decision for Final Rejection in counterpart Korean Application No. 10-2008-0027124, mailed Aug. 20, 2010.
Second Office Action in counterpart Chinese Application No. 200710127769.X, mailed Aug. 4, 2010.
$2^{nd}$ Office Action in corresponding European Application No. 08153217.8 (Nov. 30, 2010).
$2^{nd}$ Office Action in corresponding Japanese Application No. 2008-075278 (Mar. 29, 2011).
Intellectual Property Tribunal Decision in corresponding Korean Patent Application No. 10-2008-027124 (Feb. 20, 2012).
Notice of Rejection in corresponding Japanese Patent Application No. 2008-075278 (Mar. 13, 2012).
Office Action in corresponding Chinese Patent Application No. 200710127769.X (Aug. 2, 2011).
$4^{th}$ Office Action in corresponding Japanese Patent Application No. 2008-075278 (Sep. 3, 2012).
Extended European Search Report in corresponding European Patent Application No. 11165890.2 (Jul. 15, 2011).
Hearing Notice in corresponding Indian Patent Application No. 570/MUM/2008 (Aug. 13, 2012).

* cited by examiner

PRINTED CIRCUIT BOARD, DESIGN METHOD THEREOF AND MAINBOARD OF TERMINAL PRODUCT

CROSS-REFERENCE TO RELATED APPLICATIONS

This application claims benefits to Chinese Patent Application No. 200710090909.0, entitled "Printed Circuit Board and Design Method Thereof" and filed on Mar. 23, 2006, and Chinese Patent Application No. 200710127769.X, entitled "Printed Circuit Board, Design Method Thereof and Mainboard of Terminal Product" and filed on Jun. 28, 2007, both of which are incorporated herein by reference in their entireties.

FIELD OF THE INVENTION

The present invention relates to Printed Circuit Board (PCB) technologies, and particularly to a multi-layer printed circuit board and a design method thereof. The invention also relates to a mainboard of a terminal product using such printed circuit board.

BACKGROUND OF THE INVENTION

A printed circuit board is a structural element formed of insulated materials together with conductor wirings, and is applied to various communication and electronic devices. Printed Circuit Board technologies have been developing continuously, enabling an initial single sided board to evolve into a double sided board and further into a multi-layer board. At present, the four-layer board and six-layer board are dominant in wide applications. The development trend of the printed circuit board is High Density Interconnection (HDI) technology, in which high density interconnection is achieved mainly by arranging microvias together with fine lines with the use of microvias technology, so that a space utilization ratio is improved. Typically, in the microvias technology, Laser Ablation, Plasma Etching or Photo-via can be used.

At present, a structure of a six-layer HDI broad, including an HDI board of a six-layer one-level 1+4+1 structure or an HDI board of a six-layer two-level 1+1+2+1+1 structure, is typically adopted for a terminal-like mainboard PCB. As the integration level of devices is improved increasingly, a hardware cost of the PCB is lowered continuously. The cost of the mainboard PCB is an increasing proportion of the hardware cost of a whole machine, and the signal quality in the PCB also has a direct influence on the performance of the whole device. Therefore, the mainboard PCB is a major factor having an influence on the performance and the price of a terminal product.

However, the existing six-layer HDI board has a relatively high cost due to excessive fabrication processes, a long process cycle and numerous board material layers. Further, the six-layer HDI board can not be easily made thin in shape due to the fact that the insulation strength between every two of the numerous layers shall be guaranteed necessarily, and that a dielectric layer between respective signal layers shall not be too thin because a too thin inner dielectric layer may result in a lowered qualified rate directly. Currently, a non-laser via dielectric layer by most PCB manufacturers typically has a dimension of above 4 mil due to limitations of the technologic level, and therefore the existing six-layer one-level HDI board has a typical thickness of 0.8 mm or above, and the fabrication cost will be increased in proportion to a thickness below 0.8 mm.

SUMMARY OF THE INVENTION

An object of embodiments of the invention is to provide a printed circuit board and a design method thereof, so that the fabrication cost can be reduced and the reliability of a board can be improved while maintaining essential performances of the original multi-layer printed circuit boards through the design by layer reduction.

Another object of the embodiments of the invention is to provide a mainboard of a terminal product, so that the fabrication cost can be reduced and the performance and reliability of the mainboard of a low end terminal product can be improved through the design by layer reduction.

In view of the above, the invention can be practiced in the following technical solutions.

According to an aspect of the invention, there is provided a design method for printed circuit boards, and the design method includes: wiring signal lines on an area basis at inner layers adjacent to outer surface layers; arranging the outer surface layers with no wiring or few wirings and interconnecting the outer surface layers by way of through vias, so that the outer surface layers function as a primary ground; and setting parameters of a line width and a layer height to control a target impedance value.

According to another aspect of the invention, there is provided a printed circuit board including outer surface layers and at least one inner layer between the outer surface layers. The inner layer adjacent to the outer surface layer is used for signal lines arrangement, and the signal lines are wired on an area basis at the inner layer; and the outer surface layers are arranged with no wiring or few wirings, and are interconnected as a primary ground by way of through vias.

According to still another aspect of the invention, there is provided a mainboard of a terminal product, including a core chip of a baseband or radio frequency module. The mainboard of the terminal product is a four-layer printed circuit board including surface layers and two inner layers between the surface layers; the surface layers including a top layer and a bottom layer which are respectively a primary reference ground layer consisted of a ground copper sheet with a large area, and the ground copper sheets with a large area of the top layer and the bottom layer are interconnected by way of through vias; and the inner layers are primary wiring layers where wiring areas are divided by functions. A distance between the inner layers is greater or equal to that between the surface layers and the respective inner layers adjacent thereto; and the wiring area at each of the inner layers corresponds to the ground copper sheet area with a large area at a layer adjacent to the inner layer or vertically arranged wirings at the layer adjacent to the inner layer.

The so called terminal product in the invention includes, but not limited to a mobile phone, a PDA, a fixed station, a data card, an MP3/4, a GPS navigation positioning system and a modular product derived therefrom. The mainboard of the terminal product in the invention can be a four-layer printed circuit board including a core chip of a baseband or radio frequency module. At least one BGA-packaged device is provided on the four-layer printed circuit board. The pin pitch of the BGA-packaged device may be, but not limited to any or combination of 1 mm, 0.8 mm, 0.65 mm, 0.5 mm and 0.4 mm. The board thickness of the four-layer printed circuit board ranges inclusively from 0.4 mm to 2 mm.

As can be seen from the technical solutions according to the embodiments of the invention, the existing six-layer printed circuit boards have a relatively high fabrication cost due to excessive fabrication processes, numerous board material layers and the like. In the design solutions by layer reduction of a printed circuit board provided in the embodiments of the invention, the signal lines are wired on an area basis at the inner layers adjacent to the outer surface layers; the outer surface layers are arranged with no wiring or few wirings and are interconnected as a primary ground through the through vias; and the parameters of the line width and the layer height are set to control the target impedance value. Each of the two inner layers primarily for wiring is adjacent to the respective outer surface layer, with a short interlayer distance between the inner layer and the outer surface layer, and the outer surface layers are arranged with no wiring or few wirings, therefore, the outer surface layers can be interconnected well through the through vias to provide a good return current ground for the adjacent inner layers, thereby reducing signal crosstalk. Further, the interlayer distance between the two inner layers is far above (>=2 times, preferably >=3 times) the distance from each of the inner layers to an outer surface layer closest to the inner layer. With such an inter-layer distance arrangement, the crosstalk between wirings at one of the two inner layers and those at the other one can be made far below the crosstalk between the wirings at each of the inner layers and those at the outer surface layer closest to the inner layer. In view of that the consistency of impedance control on wired radio frequency signal lines is preferential over the resultant impedance control target value, the consistency of the line width and the layer height can be controlled so as to control the resultant impedance control target value indirectly. The resultant impedance control target value can be guaranteed if only the line width/the layer height reaches the designed parameter. Therefore, the design solutions by layer reduction of a printed circuit board provided in the embodiments of the invention can control reasonably the signal crosstalk and perform impedance control, so as to reduce greatly the fabrication cost while maintaining essential performances of the original multi-layer printed circuit board.

In the four-layer printed circuit board and the design method thereof according to the invention, the idea of the design method by layer reduction can be extended to a design of reducing an M-layer board to an N-layer board to reduce the cost through layer reduction, where M>N.

The surface layers and the respective inner layers adjacent thereto of the four-layer printed board of the 2+2 structure with mechanical blind vias are implemented with double sided boards. The double sided board can be provided with mechanical vias in replace of Laser blind vias in a conventional HDI board. For the four-layer printed board, it is required that devices arranged at one of the surface layers is displaced from those arranged at the other one in a projection direction. The multi-layer board is provided with through vias in replace of buried vias in a conventional HDI board. Thus, a laser drilling process for a conventional HDI board can be omitted. Further, there is a process requirement in the invention that surface areas of the through vias shall be coated with white oil.

In the design by layer reduction of a printed circuit board according to the invention, a six-layer HDI board with laser vias of a one-level 1+4+1 structure and that of a two-order 1+1+2+1+1 structure can be replaced with a four-layer printed circuit board of a 1+2+1 structure with laser blind vias or that of a 2+2 structure with mechanical blind vias so as to reduce the cost of the printed circuit board and improve the reliability of the printed circuit board while maintaining equivalent performances of circuit board.

In the technical solutions provided according to the invention, a signal return current in the case of no separate complete ground layer can be improved by controlling reasonably the signal crosstalk, and approaches such as the technology of complete connection of a ground copper sheet and processing of signals by groups can be used to control reasonably noises of the whole board and guarantee effectively a quality of crucial signals, so that performance of the whole board of the four-layer PCB board of a 1+2+1 structure with laser blind vias or a 2+2 structure with mechanical blind vias can be ensured not to be below the performance achieved by the design for the six-layer HDI board with laser vias. Applications of this innovative PCB design technology can reduce effectively the PCB cost by more than 20%, improve greatly both competitiveness and profits of products and improve the reliability of the products, and therefore will become core technologies for a design of terminal-like products.

According to the invention, for example, an existing six-layer board with laser vias and buried blind vias can be reduced to a four-layer board of a 1+2+1 structure with laser blind vias or a 2+2 structure with mechanical blind vias through the design by layer reduction of the PCB. The consumed materials are reduced, the processes are simplified, the fabrication cycle is shortened, and there are numerous fabrication manufacturers available, therefore, both the fabrication cost and the material cost are lowered. Such design idea and technical details of lowering the PCB purchase cost by layer reduction and fabrication process simplification can be extended to a design of reducing M-layer boards to N-layer boards to reduce the cost through layer reduction, where M>N.

The invention addresses the signal wiring rules, the crosstalk control, the impedance control, the design of the complete return current ground and the arrangements of laminated layers and vias, and therefore the four-layer PCB with a 1+2+1 structure with laser blind vias or a 2+2 structure with mechanical blind vias can achieve requirements for equivalent performance index of the six-layer PCB with laser vias and buried blind vias. The presented data are merely recommended values and can be varied according to specific fabrication capabilities. Parameters varied by manufacturers and parameter optimization as presented in the context will fall within the scope of this patent application.

The reliability of the inventive four-layer printed circuit board is superior to that of the original six-layer board.

The total board thickness of the inventive four-layer printed circuit board can be adjusted conveniently by changing the thickness of the laminate. The laminates are conventional board materials applied widely and are free of the risk of a short supply. Two laminates are used for the board with mechanical blind vias, and therefore under the precondition of ensuring the flatness of a board and based on the current technologic level, the thinnest fabricable laminate has a thickness of 0.2 mm/0.3 mm in the practical process, and a controllable board thickness is 0.7 mm/0.9 mm, which is slightly below a conventional board thickness of the six-layer one-level HDI board. This is suitable for a design of a thin-type device with a special requirement on the strength of a board. As the technologic capabilities of manufacturers advance, the whole board can also become thinner while keeping superior in price to the six-layer board.

BRIEF DESCRIPTION OF THE DRAWINGS

FIGS. 5 to 11 are schematic diagrams of various implementations of laminated structures of a four-layer HDI printed circuit board with laser blind vias which is used as the inventive mainboard of a terminal product according to the first embodiment;

FIGS. 12 to 15 are schematic diagrams of various implementations of laminated structures of a printed circuit board with mechanical blind vias according to the second embodiment;

DETAILED DESCRIPTION OF THE INVENTION

Figure 1:
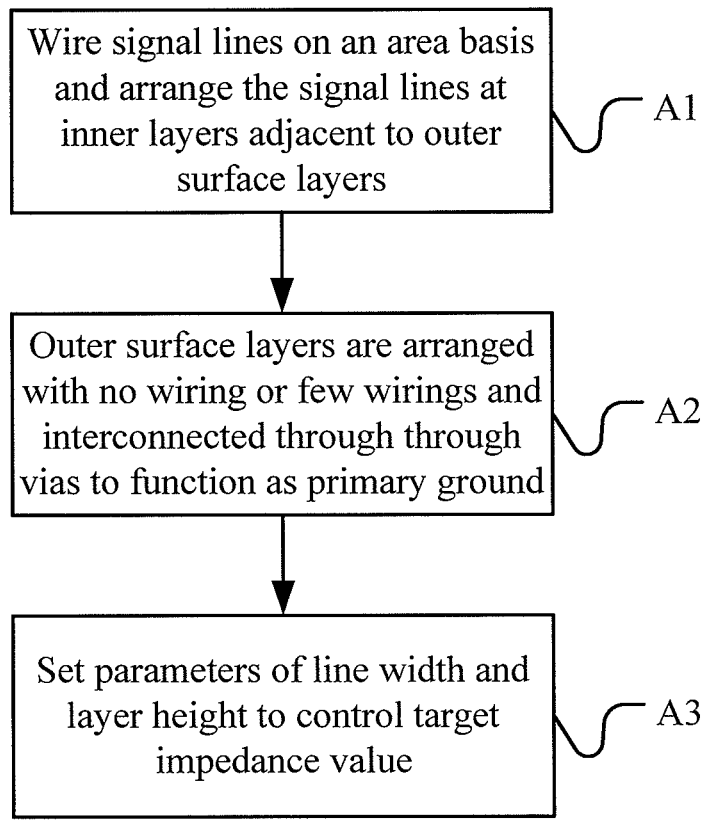
FIG. 1 is a schematic diagram of a design method according to an embodiment of the invention.

Descriptions of the invention will be given hereinafter with reference to some embodiments thereof. However, the invention can be practiced with various embodiments as defined and encompassed in the claims. The descriptions will be taken in conjunction with the drawings in which like components are denoted with like numerals.

Further, primary key parameters given herein are validated parameters but may vary along with a progress of the technologic level. Therefore, optimization of the parameters dependent upon the progress of the technologic level and variations thereof in light of the optimization idea presented herein are intended to fall within the scope of the patent application.

Concepts such as "a complete ground with a large area" and "a ground copper sheet with a large area" used in this application are relative concepts, each of which indicates such an area in a reference layer that is a projection area in the reference layer of a wiring area in a related layer and is a region with a complete ground copper sheet, with no wiring or few wirings. In the case of few wirings, an influence thereof upon performance parameters of a PCB board is limited and known to those skilled in the art and can be limited to an allowable range by those skilled in the art according to a specific scenario.

A laminated structure of an HDI printed circuit board will be described as follows.

1) For an HDI board of a six-layer one-level 1+4+1 structure, where, 1+4+1 indicates a laminated structure of the HDI board. The number of layers of the whole board is 6.

The structure is characterized in that firstly a four-layer board like a typical four-layer board with vias is fabricated. The four-layer board is located in the middle of the six-layer board and thus can be defined as layers 2, 3, 4 and 5 of the six-layer board. Then, a prepreg and a copper foil are further laminated at the top surface and the bottom surface of the four-layer board through a layer addition method to form layers 1 and 6 of the six-layer board, i.e., two outer layers. One-level blind vias can be fabricated prior to formation of layer-1 lines and layer-6 lines, to interconnect the layers 1 and 2 and the layers 5 and 6, respectively.

2) For an HDI board of a six-layer two-level 1+1+2+1+1 structure, where, 1+1+2+1+1 indicates a laminated structure of the HDI board. The number of layers of the whole board is 6.

The structure is characterized in that firstly a two-layer board like a typical two-layer board with vias is fabricated. The two-layer board is located in the middle of the six-layer board and thus can be defined as layers 3 and 4 of the six-layer board. Then, a prepreg and a copper foil are further laminated at top and bottom surfaces of the two-layer board through the layer addition method to form layers 2 and 5 of the six-layer board, i.e., two outer layers. One-level blind vias can be fabricated prior to formation of layer-2 lines and layer-5 lines to interconnect the layers 2 and 3 and the layers 4 and 5, respectively.

After the layers 2 and 5 are fabricated, a prepreg and a copper foil are further laminated at surfaces of the layers 2 and 5 with the layer addition method to form layers 1 and 6 of the six-layer board, i.e., two outer layers. One-level blind vias can be fabricated prior to formation of layer-1 lines and layer-6 lines to interconnect the layers 1 and 2 and the layers 5 and 6, respectively.

3) For an HDI board of a four-layer 1+2+1 structure with laser blind vias, where, 1+2+1 indicates a laminated structure of the HDI board. The number of layers of the whole board is 4.

The structure is characterized in that firstly a two-layer (double sided) board like a typical two-layer board with vias is fabricated. The two-layer board is located in the middle of the four-layer board and thus can be defined as layers 2 and 3 of the four-layer board. Then, a prepreg and a copper foil are further laminated at top and bottom surfaces of the two-layer board with the layer addition method to form layers 1 and 4 of the four-layer board. One-level blind vias can be fabricated prior to formation of layer-1 lines and layer-4 lines to interconnect the layers 1 and 2 and the layers 3 and 4, respectively.

4) For an HDI board of a 2+2 structure with mechanical blind vias, where 2+2 indicates a laminated structure of a PCB board. The number of layers of the whole board is 4.

The structure is characterized in that firstly two two-layer boards are fabricated, each of which is like a typical two-layer board with vias. One of the two-layer boards is defined as layers 1 and 2 of the four-layer board and the other is defined as layers 3 and 4 of the four-layer board in lamination order. Then, the two two-layer boards are laminated in lamination order to form the four-layer board. Vias interconnecting the layers 1 and 4 can be fabricated on the four-layer board.

The existing six-layer HDI boards have a relatively high fabrication cost due to excessive fabrication processes and the like. However, the embodiments of the invention provide a design method for an HDI board of a four-layer structure with laser blind vias (see FIGS. 5 to 11) or a printed circuit board of a four-layer structure with mechanical blind vias (see FIGS. 12 to 15) replacing the existing six-layer HDI boards, so that the fabrication cost can be reduced and the reliability can be improved while maintaining essential performances of the original multi-layer printed circuit boards through the design by layer reduction.

The First Embodiment

Figure 5:
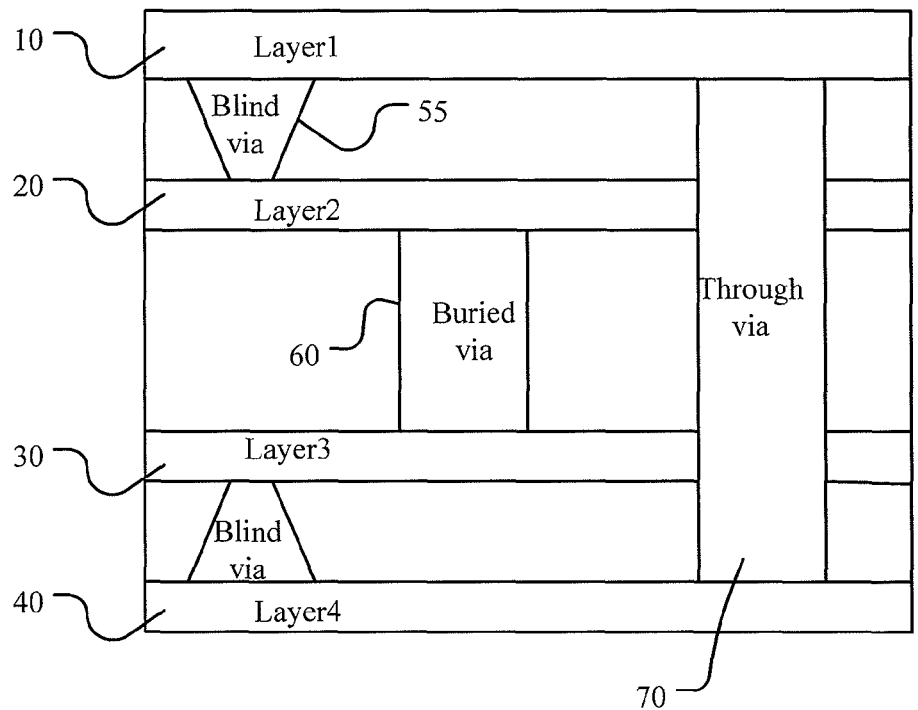
FIG. 5 is a schematic diagram of a four-layer HDI printed circuit board with laser blind vias which is used as the inventive mainboard of a terminal product according to the first embodiment.
Figure 6:
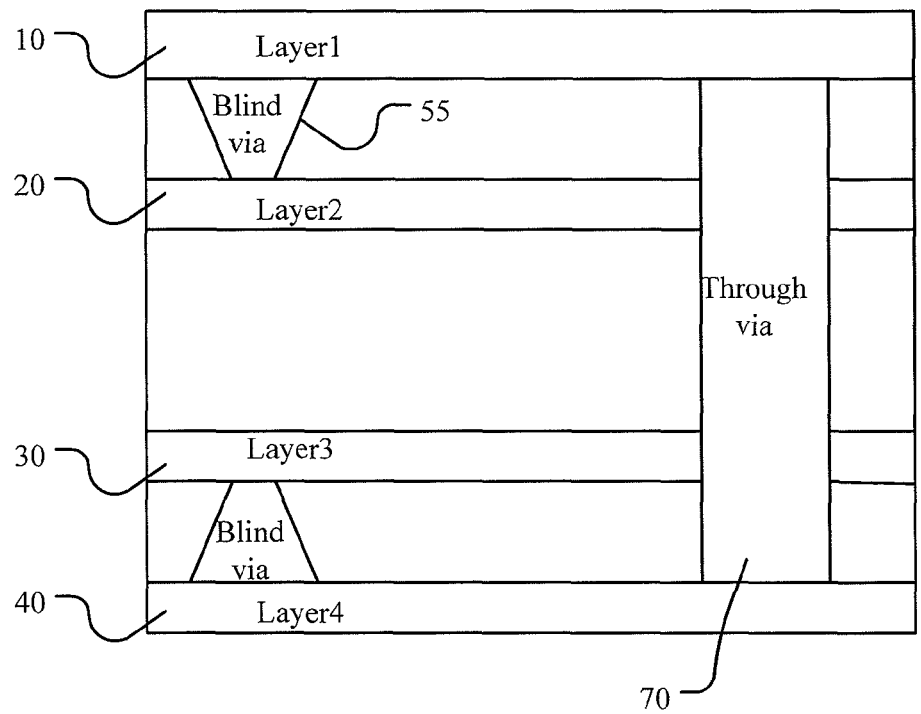
Figure 7:
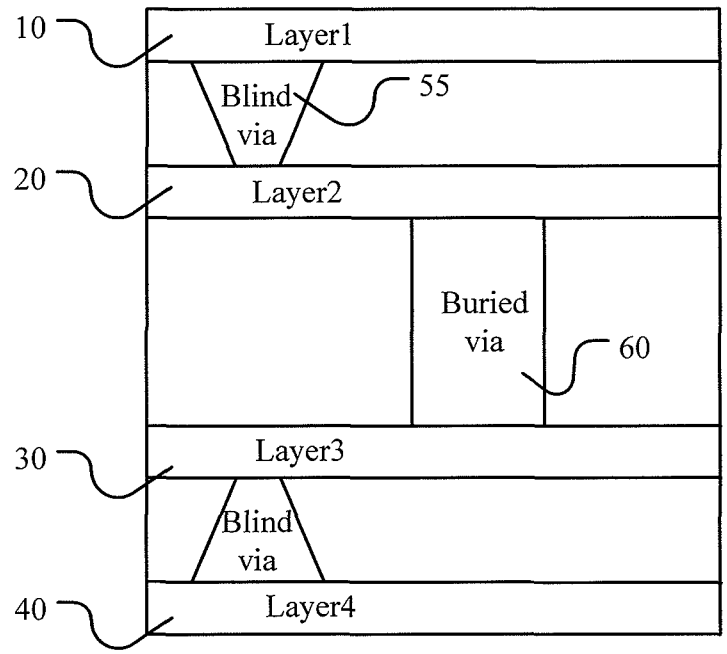
Figure 8:
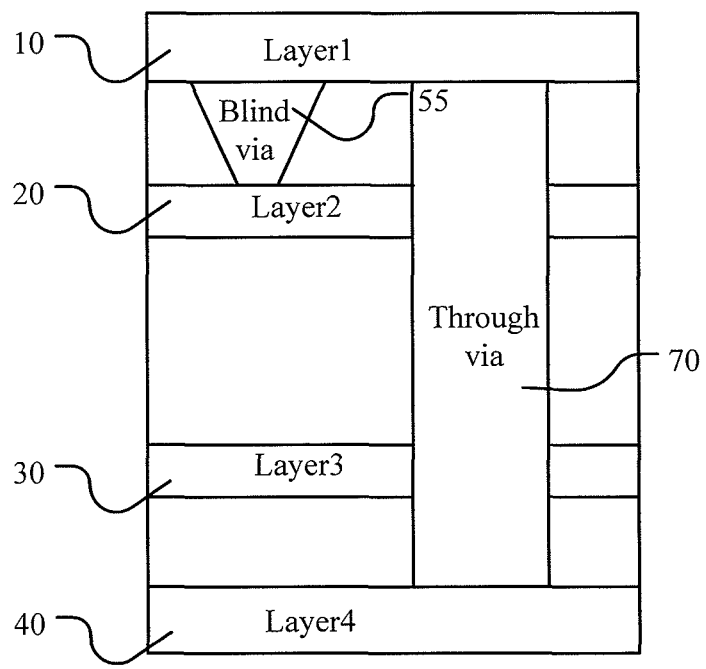
Figure 9:
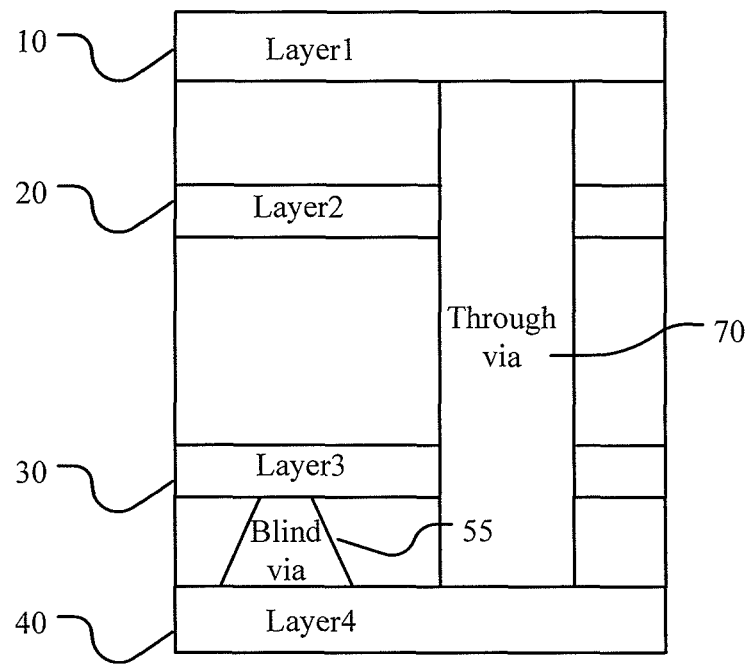
Figure 10:
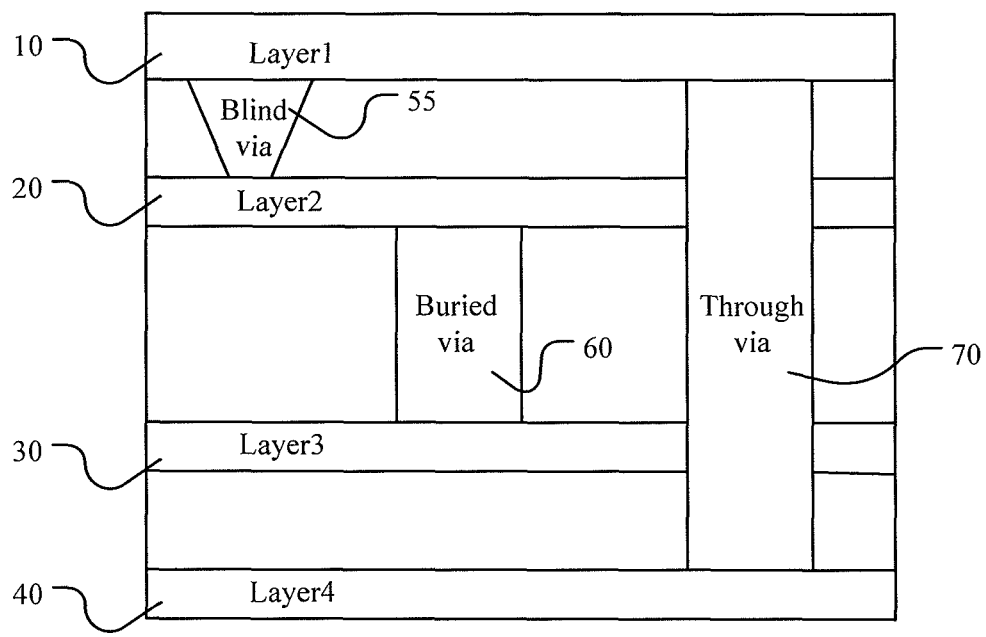
Figure 11:
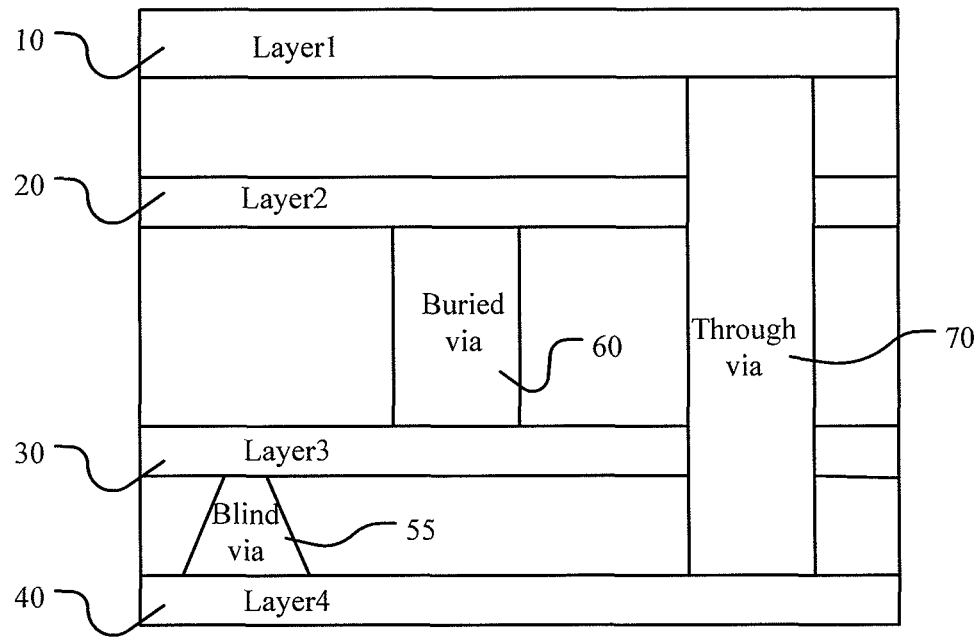

With reference to FIG. 5, a four-layer HDI board with laser blind vias designed according to the embodiment of the invention includes two outer surface layers, i.e., the first layer (layer 1) 10 and the fourth layer (layer 4) 40, and two inner layers, i.e., the second layer (layer 2) 20 and the third layer (layer 3) 30, and further includes a laser blind via 55, a buried via 60 and a through via 70. The structure illustrated in FIG. 5 is merely illustrative of one of the structure forms according to the embodiment of the invention. FIGS. 6 to 11 schematically illustrates more structure forms of the four-layer printed circuit board with laser blind vias. Specific technical details will be explained below in connection with this preferred embodiment.

Specific parameters for a design of laminated layers of the four-layer HDI board with laser blind vias are illustrated in Table 1 below.

TABLE 1

Board thickness: variable   Tolerance: +/−0.1 mm
Reference laminated structure:

| Material | Layer name | Resultant thickness |
| --- | --- | --- |
| Copper | TOP | 25 μm |
| Prepreg (FR4\LDP) | Prepreg 1080 | 60-80 μm (e.g., 60, 70, 80 μm) |
| Copper | Layer 2 | 25 μm |
| Prepreg (FR4) | Laminate | variable |
| Copper | Layer 3 | 25 μm |
| Prepreg (FR4\LDP) | Prepreg 1080 | 60-80 μm (e.g., 60, 70, 80 μm) |
| Copper | BOTTOM | 25 μm |

Thicknesses (i.e. the thickness of the prepreg between the top layer and the layer 2 and the thickness of the prepreg between the layer 3 and the bottom layer) between the surface layers and the respective inner layers adjacent thereto range from 60 μm to 80 μm.

Three examples will be given in which the thicknesses between the surface layers and the respective inner layers adjacent thereto are 60 μm, 70 μm and 80 μm respectively.

In the first example, the material of the prepregs is just prepreg, the thicknesses of the prepregs between the surface layers and the respective adjacent inner layers are 60 μm, and the material of the laminate between the layer 2 and the layer 3 is also a prepreg but has a variable thickness. Each of the top layer, the layer 2, the layer 3 and the bottom layer is made of copper and has a thickness of 25 μm. The materials, parameters and structural hierarchy of the four-layer HDI board with laser blind vias as described in this example can satisfy a requirement of miniaturization and ensure performances for normal use.

In the second example, the material of the prepregs is just a prepreg, the thicknesses of the prepregs between the surface layers and the respective adjacent inner layers are 70 μm, and the material of the laminate between the layer 2 and the layer 3 is also a prepreg but of a variable thickness. Each of the top layer, the layer 2, the layer 3 and the bottom layer is made of copper and has a thickness of 25 μm. The materials, parameters and structural hierarchy of the four-layer HDI board with laser blind vias as described in this example can satisfy a requirement of miniaturization and ensure performances for normal use.

In the third example, the material of the prepregs is just a prepreg, the thicknesses of the prepregs between the surface layers and the respective adjacent inner layers are 80 μm, and the material of the laminate between the layer 2 and the layer 3 is also a prepreg but has a variable thickness. Each of the top layer, the layer 2, the layer 3 and the bottom layer is made of copper and has a thickness of 25 μm. The materials, parameters and structural hierarchy of the four-layer HDI board with laser blind vias as described in this example can satisfy a requirement of miniaturization and ensure performances for normal use.

According to requirement of the Design For Manufacture (DFM) for mass production and recommendation based on current technologic capabilities of manufacturers, the laminate has a thickness above or equal to 4 mil, preferably above or equal to 8 mil, and the thickness can take a series of values as follows:

0.1 mm/0.2 mm/0.3 mm/0.4 mm/0.5 mm/0.6 mm/0.7 mm/0.8 mm/0.9 mm and above. This set of data can vary as a series of values of the board materials vary. Presently, the minimum board thickness recommended for the manufacturers is 0.5 mm, and here the thickness of laminate is 8 mil, and the board thickness would be increased sequentially as the thickness of laminate is increased. The board thickness can be increased for optimization. However, the board thickness can also be reduced as a result of the progress of the technologic level so as to comply with a requirement of a super thin design. The prepreg 1080 is currently selected as the most commonly used board material which has a low cost and constitutes a board having strength superior to that of a board constituted of Resin Coated Copper (RCC).

A design method for reducing a six-layer HDI board into a four-layer HDI board with laser blind vias by layer reduction according to the embodiment of the invention will be described in details below.

FIG. 1 is a schematic diagram of the design method according to an embodiment of the invention, and the method includes the following:

A1. Signal lines are wired on an area basis at the inner layers adjacent to the outer surface layers.

The signal lines are wired by functional areas in a general principle that the two inners are primary wiring layers.

A2. The outer surface layers are arranged with no wiring or few wirings, and are interconnected as a primary ground through vias.

The two outer surface layers are arranged with no wiring or few wirings, and are interconnected well through the through vias to act together as a primary reference ground, to provide a primary return current ground for the wirings at the two inner layers respectively, so that a complete return current path can be provided to reduce a signal crosstalk.

A3. Parameters of a line width and a layer height are set to control a target impedance value.

Parameters of a line width/a layer height/a dielectric DK value/a copper thickness are set, to control indirectly a resultant target impedance value by controlling the consistency of the line width/the layer height/the dielectric DK value/the copper thickness. The resultant target impedance value can be ensured as long as the line width/the layer height/the dielectric DK value/the copper thickness is set to the designed parameters. A variation of the dielectric DK value/the copper thickness has little influence on the impedance value, resulting in a variation of approximately 1 ohm, and therefore the influence of the two factors can be negligible.

It shall be noted that there is not necessarily a certain order of the steps A1, A2 and A3, and they are denoted just for the sake of descriptions.

The embodiment of the invention will be described in further details below in connection with the design method as illustrated in FIG. 1, and the following aspects are mainly involved.

1. Through via parameters and line width/line pitch are set

The embodiment of the invention adopts the same settings of through via parameters and a line width/line pitch as an existing six-layer board. Primary key parameters as presented here are validated parameters but will vary continuously along with a progress of the technologic level.

1) Laser blind via: the drilling diameter N is 5 mil and the connection pad (PAD) diameter is 12 mil. As technologic capabilities of manufacturers advance, the laser drilling diameter N will be lowered continuously and the drilled PAD diameter M will also be lowered accordingly. A relationship between the laser drilling diameter N and the drilled PAD diameter M is recommended as M>=N+D, where D is an increment value, with D>=6 mil.

2) Mechanical buried via and through via: the drilling diameter N>=8 mil, and the PAD diameter M>=N+D, where D>=10 mil. The larger the PAD is, the lower the fabrication cost will be. Therefore, the N may be increased for optimization, with the M being increased as well, but preferred line width and line pitch shall be ensured.

3) Line width/line pitch for mass production: the line width/line pitch is above or equal to 3 mil/3 mil based on the current technologic level of manufacturers. The line width/line pitch can be increased for optimization, and the fabrication cost will be lowered as well.

4) Distances from the massive copper sheet to other lines and the PAD are above or equal to 6 mil. The larger the distances are, the lower the fabrication cost will be, but an effective area of the copper sheet will be reduced, resulting in less effect of isolating and protecting important signals. Therefore, all of the above should be given attention to.

2. Signal Layer Wiring

Taking a four-layer mobile phone board as an example, one of two outer surface layers in a typical four-layer mobile phone board is configured as a keyboard arrangement side and/or a side on which a Liquid Crystal Display (LCD) screen is arranged, and the other is a side on which a primary device is arranged.

In the design method according to the embodiment of the invention, a general principle of a signal layer layout is strict area divisions by functions, resulting in a radio frequency signal area and a digital signal area, both of which are arranged respectively with an external shielding box/cavity. In the layout, devices are arranged in a traveling direction of a signal of the circuit as could as possible inside respective functional modules within the areas, so as to interconnect wirings through short lines at a surface layer as close as possible. Even if the wirings have to be interconnected through lines at an inner layer, the short lines should be considered and should not give rise to a cross as could as possible. The functional module divisions shall be clear and reasonable while considering orderly and clean appearance of the arranged devices in the layout.

A general principle of the signal layer wiring is that two inner layers are primary wiring layers and two outer surface layers are arranged with no wiring if possible. During wiring at the two inner layers, a principle of wiring at each layer is that, if possible, an area of an adjacent layer corresponding to the wiring shall be arranged with a ground copper sheet having a large area or with a few wirings arranged vertically. If the outer surface layer is the bottom surface layer, the surface layer lines should be routed as short lines, and the surface layer lines shall be inside the shielding cavity/box if possible to reduce radiation interference in a whole machine.

Wiring designs for respective signal lines will be described in details below.

2.1 Processing on Radio Frequency RF Signal Lines

RF signal lines are arranged at inner layers, to which the two layers adjacent are complete grounds with a large area. The RF signal lines can be arranged at the inner layer adjacent to the keyboard arrangement side and also can be arranged at the inner layer adjacent to the device arrangement side. The RF signal lines can also be arranged at a surface layer, to which the layer adjacent is complete ground of a large area.

2.2 Processing on Power Lines

1) Master power lines are arranged along a board edge at an inner layer, preferably at the inner layer adjacent to the keyboard arrangement side. For instance, the master power lines can be arranged at a board edge of the inner layer adjacent to the keyboard arrangement side, two adjacent layers are arranged with ground copper sheets with a large area, and the ground copper sheets at different layers are in good connectivity to each other. The master power lines and the board edge are isolated by a wide ground line or copper sheet, or ground vias may be added at an interval of distance at the isolation ground in a longitudinal direction of the isolation ground, to provide good connectivity of the isolation ground to the ground at another layer.

2) Other power lines are arranged at an inner layer, preferably at the inner layer adjacent to the keyboard arrangement side. If possible, the wirings shall avoid overlapping vertically with the keyboard PAD, and shall cross the wirings at another inner layer as infrequently as possible but cross it, if present, as vertically as possible.

2.3 Processing on Important Audio Signal Lines

Important audio signal lines are wired preferably at the inner layer adjacent to the keyboard arrangement side. The wired audio signal lines correspond to a portion at the keyboard arrangement side that is arranged with a ground copper sheet with a large area, and are kept away from keyboard PADs, and a portion of the other inner layer adjacent to the audio signal lines is a complete ground copper sheet if possible. If wirings have to be arranged in this part, then the wirings shall be as few as possible and be arranged vertically, but will not be clock signal lines as could as possible. If the audio signal lines are arranged at the inner layer adjacent to the primary device arrangement side, then two adjacent layers adjacent to this inner layer are required to be complete ground copper sheets if possible and especially the device pin PADs for high speed signals and power signals in the primary device arrangement side should be avoided. The audio signal lines are isolated from surrounding signal lines at the same layer through a ground line which is interconnected well with a ground having a large area at other layer or the same layer.

Typically, the audio signal lines are not arranged at a surface layer unless the signal lines extend out very shortly, or, have a limited length inside a shielding box or cavity. An adjacent layer beneath pin PADs for the audio signal lines and audio signal lines at a surface layer shall be complete ground copper sheets, so that quality of an audio signal may be ensured.

2.4 Processing on Data Buses

Data buses are wired preferably at the inner layer adjacent to the primary device arrangement side. The data buses are wired at the same layer if possible, and a surface-layer short line is needed for layer switching in the case of a cross of the data buses. Generally, existing data buses are distinguished by neither categories nor clusters, but in the design method according to the embodiment of the invention, data buses are clustered by categories and wired by clusters, and clusters are isolated from each other through a ground line, thereby reducing crosstalk. The ground line for isolation is interconnected well with the ground having a large area and a ground at other layers. Distinguishable data bus clusters include Liquid Crystal Display (LCD) data lines, interface lines, Joint Test Action Group (JTAG) lines, serial port lines, User Identity Module (UIM) card lines, keyboard lines, multimedia data lines and address lines, etc.

2.5 Processing on Clock Signal Lines

Clock signal lines are wired preferably at the inner layer adjacent to the keyboard arrangement side. The wired clock signal lines correspond to a portion at the keyboard arrangement side that is arranged with a ground copper sheet with a large area, and are kept away from keyboard PADs, and a portion of the other inner layer adjacent thereto is a complete ground copper sheet if possible. If wirings have to be arranged in this part, then the wirings shall be as few as possible and be arranged vertically, but will not be audio signal lines as could as possible.

2.6 Processing on Multimedia Signal Lines

Multimedia signal lines are wired preferably at the inner layer adjacent to the primary device arrangement side. The multimedia signal lines are wired at the same layer if possible, and a surface-layer short line is needed for layer switching in the case of a cross of the multimedia signal lines. Generally, existing multimedia signal lines are distinguished by neither categories nor clusters, but in the design method according to the embodiment of the invention, multimedia signal lines are clustered by categories and wired by clusters, and clusters are isolated from each other through a ground line, thereby reducing crosstalk. The ground line for isolation is interconnected well with the ground having a large area and a ground at other layers.

2.7 Design of Primary Ground

In a six-layer HID board, one of inner layers can function as a primary ground, which is used to provide a return current path for signals, thereby reducing crosstalk between the signals. In the six-layer HDI board, a complete return current ground with a large area can be provided by having an inner layer acting as the primary ground, so that crosstalk among the signals using the primary ground as the signal return current path is low. In contrast, a four-layer HDI board includes only two inner layers, and it is not feasible to have one of the inner layers acting as a primary ground, in other words, no complete primary ground at any layer can be provided. Consequently, a major problem of the four-layer board is an incomplete copper sheet of the primary ground, resulting in a discontinuous and incomplete return current path of high speed signals, so that crosstalk occurs likely. In the design of the embodiment of the invention, the two outer surface layers are arranged with no wiring or with wirings as few as possible and are interconnected well through the through vias to act together as a primary reference ground which provides the wirings at the two inner layers respectively with a primary return current ground, so that a complete return current path can be provided and a signal crosstalk can be reduced. After wiring is completed, all blank areas are spread with ground, and patches of the ground copper sheet are interconnected well with the large-area ground copper sheet through sufficient ground vias.

2.8 A Policy of Wiring in a BGA Area for Improving Effectively an EMC Performance of the Whole Board; this Policy is Adapted for All HDI Boards with Laser Blind Vias Instead of being Limited to a Four-Layer Board.

1) Laser microvias are arranged exactly below device PADs, so that PADs for laser through vias will not cause an area at a board surface layer occupied by signals to be increased.

2) The surface is arranged with no wiring but spread with a ground mesh copper sheet with a large area, and continuity and uniformity of the copper sheet with a large area will be ensured if possible with the current PCB fabrication process. The ground mesh copper sheet at the surface can function as a reference plane layer of devices and absorb effectively noises of the devices. The ground mesh is closer to the devices than any ground plane layer of a conventional high speed digital board and therefore has the best effect of ground plane. As a result, EMI noises radiated from bodies of the devices can be reduced greatly.

3) If a surface is to be arranged with wirings, then the wirings shall be as short as possible so as not to damage interconnectivity of the large-area ground copper sheet at the surface layer.

4) The primary wiring layer is a sub-surface layer (i.e., an inner layer adjacent to the surface layer). Likewise, a large-area ground mesh copper sheet at the surface layer provides a primary reference return current ground for numerous wirings at the sub-surface layer. Owing to the structure of the HID board, the distance between the surface layer and the sub-surface layer is shorter than the distance between any conventional layers, therefore, various signals are closest to the return current ground thereof in this case, so that most energy of the signals can be coupled between the signals and the return current ground of the signals, resulting in greatly reduced outward radiation.

5) The distance of signal lines arranged at the sub-surface layer from a signal reference plane (the adjacent surface layer) of the signal lines is generally much shorter than the shortest distance between signals at the same layer and is typically below 2.8:4. Therefore, the crosstalk between signals is far lower than a coupled part between the signals and their return current signals, and the crosstalk between the signals can be suppressed effectively.

6) The ground mesh copper sheet at the surface layer is not completely continuous due to presence of installation pads of devices at the surface layer. A primary discontinuous area is referred to as a BGA device area. A diameter of a BGA device pad is typically 10 mil, 12 mil, 14 mil, 16 mil, etc., but if the rule 1) is observed, then current BGA pads of PITCH>=0.5 mm can still be interconnected through the copper sheet under the condition of the existing PCB fabrication process capabilities.

7) Design rules for Spacing Rule Set in a PCB design tool include the following rules.

P=2S+W P>=0.5 mm W>=3 mm

P: a distance between centers of BGA pad pins

S: a distance between copper sheet or wiring and pad

W: the narrowest width of copper sheet or wiring

The above descriptions of wiring at the signal layer are summarized as follows.

Wiring in an existing six-layer board can be easy due to presence of four inner layers. The same number of lines now will be arranged in a four-layer board, and the signal crosstalk shall be considered. Preferably, two inner layers function as primary wiring layers in the four-layer board. Due to the special laminated structure of the four-layer board, each of the two primary wiring layers is adjacent to an outer surface layer with a short interlayer distance. The outer surface layers are arranged with few wiring, and thus can be interconnected well through the through vias to provide a good return current ground for the adjacent inner layers. Furthermore, the interlayer distance between the two inner layers is far above (>=2 times, preferably >=3 times) the distances from the two inner layers to the respective closest outer surface layers, as a result, according to deduction of the theory in spatial distribution of electromagnetic field, the crosstalk between wirings at the two inner layers arranged with such a distance can be far below the crosstalk between the wirings at the inner layers and those at the respective closest surface layer, approximately 10% of the latter. Therefore the crosstalk between signals of the whole board can be controlled effectively based upon the above rules of wiring at the signal layer. If the maximum crosstalk is defined as the crosstalk in the case that the wirings at a surface layer and those at the respective adjacent layer overlap each other completely, then crosstalk between signals in the four-layer HDI boards with wirings based upon the above rules of wiring at the signal layer can be only approximately 10% of the maximum crosstalk without consideration of an accumulative effect.

3. Impedance Control Design

During current PCB fabrication, a resultant impedance control target value is generally proposed at a design phase, and is subsequently achieved by manufacturers through adjustment dependent upon their respective fabrication levels. However, wirings are short in a terminal-like board such as a mobile phone board, and the consistency (or referred to as continuity) of impedance control on wirings for radio frequency signal lines will be preferential over the resultant impedance control target value. In compliance with this principle, the consistency of a line width/a layer height/a dielectric DK value/a copper thickness is controlled so as to control the resultant impedance control target value indirectly in the design method according to the embodiment of the invention. The resultant impedance control target value can be guaranteed if the line width/the layer height/the dielectric DK value/the copper thickness reaches the designed parameter. This method can ensure the consistency of the whole-board electric performances of the boards manufactured by different PCB manufacturers while ensuring impedance control. This will be advantageous to adjusting of circuit parameters, facilitate guaranteeing margins of various electric indexes and enable the board to operate more stably and reliably.

Due to the uniform design of impedance control in the four-layer board, more direct impedance control can be enabled by controlling the line width/the layer height. This can also reduce a workload of manufacturers for an impedance test and thus lower the fabrication cost. An impedance control patter can be fabricated at an auxiliary edge for board splicing of unit boards to act as a backup test pattern during debugging.

3.1 Analysis on Impedance Control Tolerance

In the design method according to the embodiment of the invention, a typical line width tolerance is defined as +/−20%, and typical board material thickness tolerance ranges are illustrated as Table 2 below.

TABLE 2

| | Thickness H (mil) | | |
|---|---|---|---|
| | H <= 4 mil | 4 mil < H <= 8 mil | 8 mil < H |
| Tolerance D (μm) | +/−15 | +/−25 | +/−50 |

Primary factors relevant to impedance control are the line width/the layer height/the dielectric constant/the copper thickness. A variation of the dielectric DK value/the copper thickness has little influence on the impedance value, resulting in a variation of approximately 1 ohm, and therefore the influence of the two factors can be negligible. In view of the features of the fabrication process, the layer height is substantially reduced because basic materials are to be moved to fill vias and to fill copper-free areas in lamination of the PCB. If the board material thickness exceeds the designed thickness, the excessive thickness shall be within the designed tolerance range. After via filling and copper-free area filling by laminating, the thickness of the excessively thick board material can be reduced. As a whole, the board material thickness will not reach the positive tolerance, and it is possible to consider only the negative tolerance range. Further, a resultant line width is always below the designed line width due to undercut, and therefore it is possible to consider only an influence of the line width taking the negative tolerance upon the target impedance value.

Generally, the line width and the layer height tend to be decreased. The smaller the line width is, the higher the impedance will be, and the smaller the layer thickness is, the lower the impedance will be. Therefore, if both the line width and the layer thickness are decreased, the influence of the line width error upon the impedance complements that of the layer thickness error upon the impedance. Thus, the maximum tolerance range of a single factor will give rise to maximum influence upon the impedance.

Several line structures and impedance calculations will be described in details below.

3.2 Micro Strip Structure and Impedance Calculation Conditions

Figure 2:
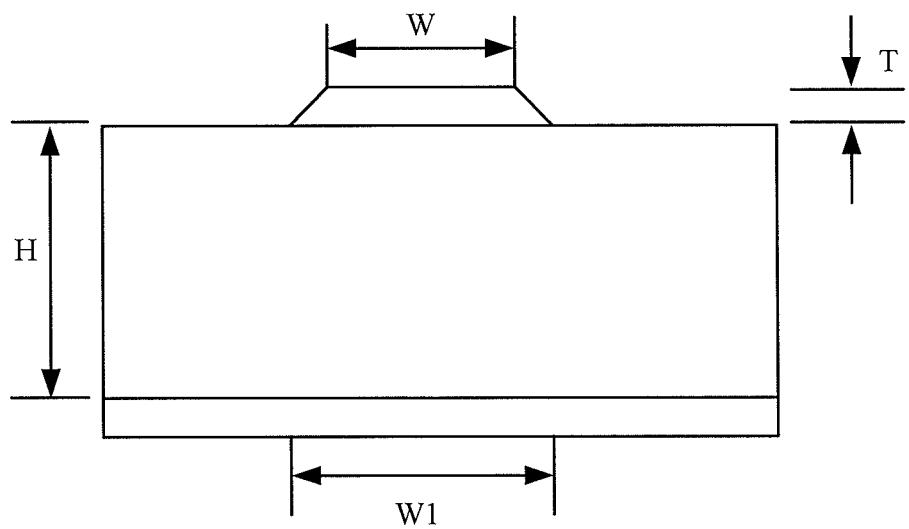
FIG. 2 is a schematic diagram of a first micro strip according to a first embodiment of the invention.

With reference to FIG. 2 illustrating a schematic diagram of a first micro strip according to the first embodiment of the invention, W1 denotes a line width, W denotes a line width after undercut, T denotes a copper thickness, and H denotes a height of the layer of the prepreg.

The designed values and control values of the impedance of a 50-ohm micro strip are illustrated in Table 3 below for reference, and the calculation tool is CITS25 VERSION 2004.

TABLE 3

| | Designed value | Control value |
|---|---|---|
| Layer height H (mil) | 2.8 | 2.8 |
| Line width W1 (mil) | 5 | 5 |
| Line width tolerance | +/−20% | +20/−15% |
| Layer height tolerance (μm) | +/−15 | +/−10 |
| Target impedance and tolerance (ohm) | 50 +/− 7 | 50 +/− 5 |

Figure 3:
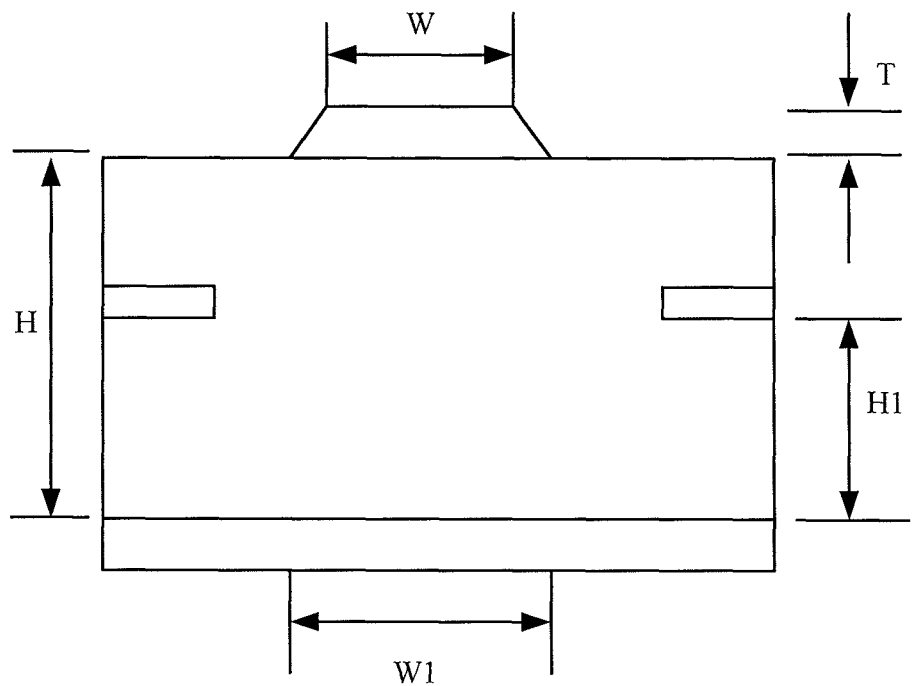
FIG. 3 is a schematic diagram of a second micro strip according to the first embodiment of the invention.

3.3 Micro Strip Structure with Caverned Sub-Surface Layer and Impedance Calculation Conditions With reference to FIG. 3 illustrating a schematic diagram of a second micro strip according to the first embodiment of the invention, W1 denotes a line width, W denotes a line width after undercut, T denotes a copper thickness, H denotes a height of the layer of the prepreg and the laminate, and H1 denotes a height of the layer of the laminate.

Designed values of the impedance of the 50-ohm micro strip with a caverned sub-surface layer are illustrated in Table 4 below for reference, and the calculation tool is CITS25 VERSION 2004.

TABLE 4

| Layer height H (mil) | 2.8 + Laminate |
|---|---|
| Laminate H1 (mm) | 0.2 + D1 |
| Line width W1 (mil) | 23 + D2 |
| Line width tolerance | +/−20% |
| Layer height tolerance H + Laminate (μm) | +/−50 |
| Target impedance and tolerance (ohm) | 50 +/− 5 |

In Table 4, an appropriate value dependent upon the thicknesses of laminate can be assigned to the increment value D2, to reach the calculation target impedance of 50 ohm. The thickness of laminate is equal to 0.2 mm or above, and the increment value D1 may be a multiple of 0.05 mm.

3.4 Buried Strip Structure and Impedance Calculation Condition

Due to the special structure (1+2+1) of the four-layer board, the strip has the highest impedance of approximately 36 ohm only even if being fabricated to have the minimum line width of 4 ml, and the impedance of 50 ohm can be achieved only if the surface layer is caverned to form a buried strip structure.

Figure 4:
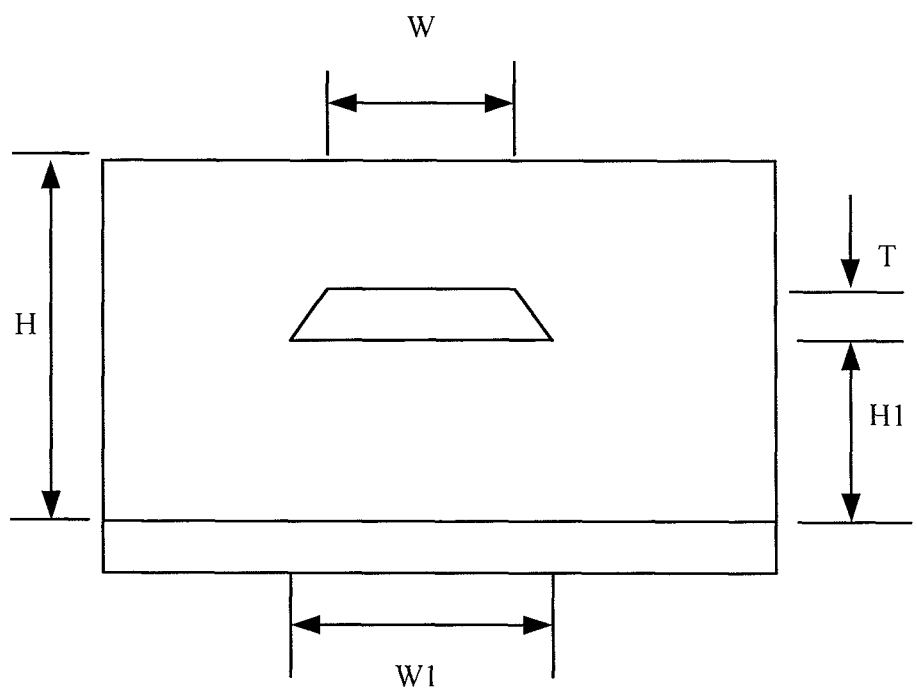
FIG. 4 is a schematic diagram of a third micro strip according to the first embodiment of the invention.

With reference to FIG. 4 illustrating a schematic diagram of a third micro strip according to the first embodiment of the invention, W1 denotes a line width, W denotes a line width after undercut, T denotes a copper thickness, H denotes a height of the layer of the prepreg and the laminate, and H1 denotes a height of the layer of the laminate.

Designed values of the impedance of the 50-ohm buried micro strip are illustrated in Table 5 below for reference, and the calculation tool is CITS25 VERSION 2004.

TABLE 5

| Layer height H (mil) | 2.8 + Laminate |
| Laminate H1 (mm) | 0.2 + D1 |
| Line width W1 (mil) | 12.5 + D2 |
| Line width tolerance | +/−20% |
| Layer height tolerance H (μm) | +/−50 |
| Target impedance and tolerance (ohm) | 50 +/− 5 |

In Table 5, an appropriate value dependent upon the thicknesses of laminate can be assigned to the increment value D2, to reach the calculation target impedance of 50 ohm. The thickness of laminate is equal to 0.2 mm or above, and the increment value D1 may be a multiple of 0.05 mm.

The followings shall be considered in impedance control design.

1) In the case of a 4-mil line width, the normal line width reaches the lowest limit, and the impedance value will be reduced greatly. In order to avoid a reduced product quantified ratio caused by the variant of impedance value, the minimum line width of the strip for impedance control shall be controlled to be above or equal to 5 mil.

2) The error range of impedance control of +/−7 ohm is used preferably, so that a mass-production qualified board can surely satisfy impedance control requirements if only the calculated impedance value is 50 ohm. Therefore, neither additional designation of impedance control nor additional cost for impedance control will be required.

3) To reduce the error of impedance control to below or equal to +/−5 ohm, a wide line is used preferably instead of increasing the line width and the dielectric thickness control tolerance, so as not to increase the material cost.

4) A density of vias is controlled to be not too high, and a process in which a ground copper sheet is spread over a blank area can control the layer thickness not to be reduced too much, so that a reduced impedance control tolerance can be ensured indirectly.

A test of the four-layer HDI board fabricated by the design method according to the embodiment of the invention shows that it can achieve the same performance as the six-layer HDI board. In addition, the middle laminate of the four-layer board is relatively thick and thus has better strength of anti-high temperature and anti-high pressure than a thin laminate, therefore, the four-layer board with the relatively thick laminate is superior to the six-layer board in flatness, and also has a better performance of anti-high temperature. The four-layer HDI board also passes smoothly other reliability tests, such as Electrical Static Discharge (ESD)/Electromagnetic Compatibility (EMC)/Temperature rise test/high and low temperature test/anti-impact/dropping. Through the design method by PCB layer reduction according to the embodiment of the invention, the existing six-layer HDI board is reduced to the four-layer HDI board by layer reduction while the performance is kept substantially unchanged, so that both the fabrication cost and the material cost are reduced due to the reduced number of materials to be used and the shorter fabrication process.

It shall be noted that the embodiment of the invention is stated by an example in which an existing six-layer HDI board is reduced to a four-layer HDI board by layer reduction design but will not be limited to this. The design idea and technical details for lowering the PCB fabrication cost by the design by layer reduction can be extended to a design of reducing an M-layer board to an N-layer board, where M>N.

The Second Embodiment

Figure 12:
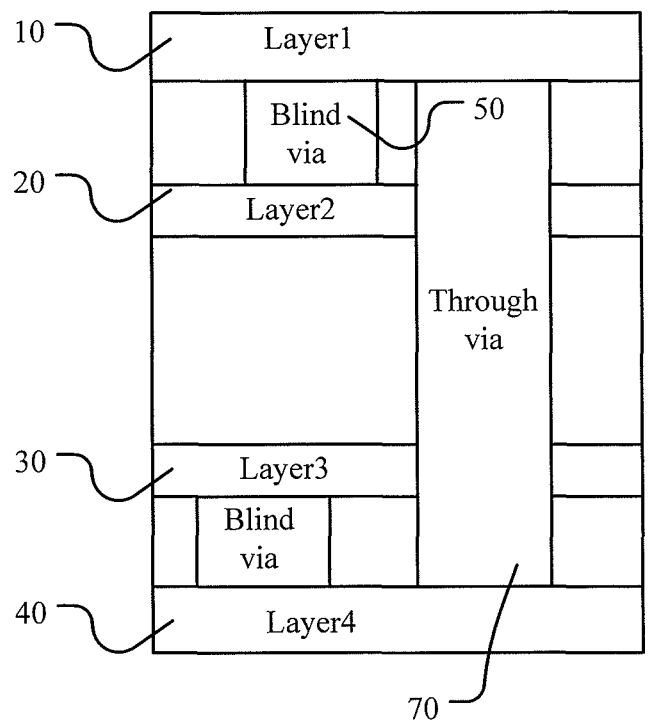
FIG. 12 is a schematic diagram of a structure of a four-layer HDI printed circuit board with mechanical blind vias which is used as the inventive mainboard of a terminal product according to a second embodiment.
Figure 13:
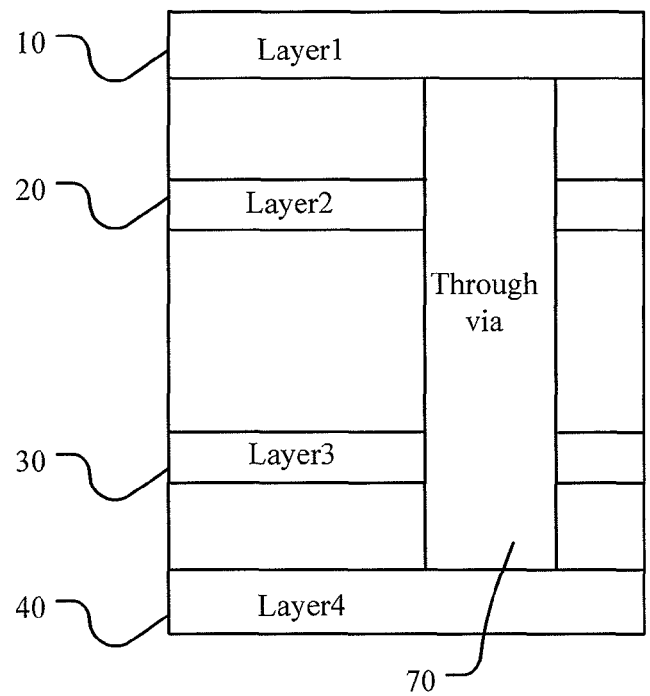
Figure 14:
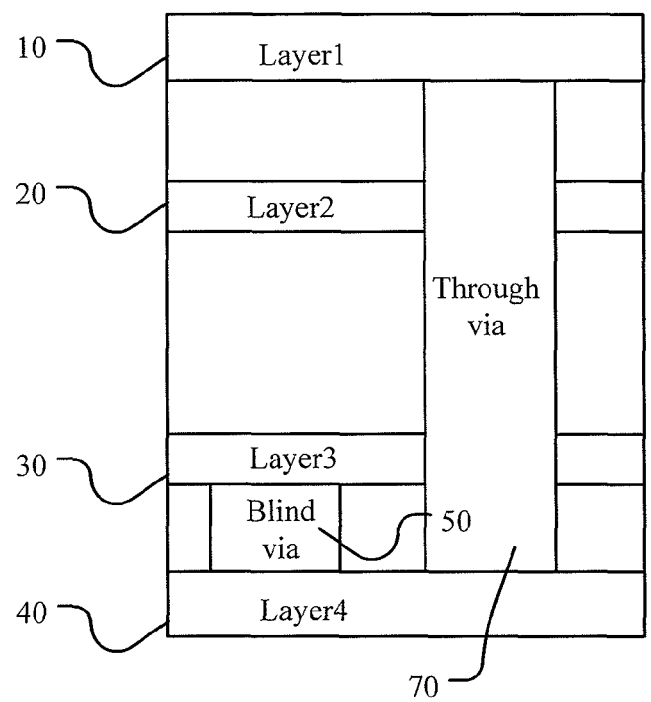
Figure 15:
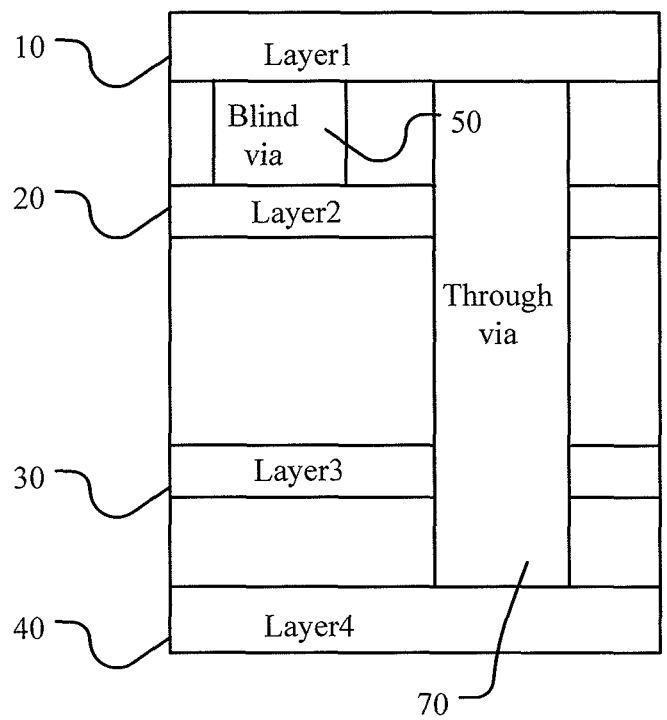

With reference to FIG. 12, a four-layer PCB board with mechanical blind vias designed according to the embodiment of the invention includes: two surface layers, i.e., the first layer (layer 1) 10 and the fourth layer (layer 4) 40; and two inner layers, i.e., the second layer (layer 2) 20 and the third layer (layer 3) 30. The four-layer PCB board further includes a blind via 50 and a through via 70. The structure illustrated in the FIG. 12 is merely illustrative of one of structure forms of a four-layer PCB board with mechanical blind vias in the embodiment of the invention, and further structure forms of the four-layer PCB board with mechanical blind vias are shown in FIGS. 13-15.

Special technical details of the four-layer PCB board with mechanical blind vias will be explained below in connection with the preferred embodiment. The embodiment of the four-layer HDI board with laser blind vias can be made reference to for other technical details.

1. Via Parameters, a Line Width and a Line Pitch in Connection with the Above Structure The same parameter setting of mechanical vias and setting of the line width and the line pitch as the existing six-layer HDI PCB board are adopted. It shall be additionally noted that primary key parameters as presented herein are validated parameters but will vary continuously along with the progress of technologic level. This also applies to the specific data of the technical parameters below. Therefore, such parameters are just recommended for reference, and optimization of the parameters along with the progress of the technologic level and variations thereof in light of the optimization idea presented in the context will fall within the scope of this patent application.

For the mechanical blind via: the drilling diameter is denoted with N, and N>=8 mil; and the PAD diameter M=N+10 mil, and the larger the PAD is, the lower the fabrication cost will be. Therefore, N can be increased for optimization, so that M is increased, but preferred line width and line pitch shall be guaranteed.

2. Design for Laminated Layers

Only a laminated layer design of a 2+2 four-layer board with mechanical blind vias will be given here. A four-layer through-via board without mechanical blind via is a conventional four-layer board structure and its design technology is mature, and detailed descriptions thereof will be omitted.

Specific parameters of a design for laminated layers of the four-layer HDI board with mechanical blind vias are illustrated in Table 6 below.

TABLE 6

Board thickness: variable   Tolerance: +/−0.1 mm
Reference laminated structure:

| Material | Layer name | Resultant thickness |
|---|---|---|
| Copper | Top wiring layer (Layer 1) | 25 μm |

TABLE 6-continued

Board thickness: variable  Tolerance: +/−0.1 mm
Reference laminated structure:

| Material | Layer name | Resultant thickness |
|---|---|---|
| Laminate of double sided board | Laminate layer | >=0.1 mm |
| Copper | The second wiring layer (Layer 2) | 25 μm |
| Prepreg (FR4) | Prepreg | variable |
| Copper | The third wiring layer (Layer 3) | 25 μm |
| Laminate of double sided board | Laminate layer | >=0.1 mm |
| Copper | Bottom wiring layer (Layer 4) | 25 μm |

According to requirement of the DFM for mass production and recommendation based on current technologic capabilities of manufacturers, the laminate has a thickness above or equal to 4 ml, which can take a series of values including 0.1 mm/0.2 mm/0.3 mm/ . . . etc.

In view of current technologic capabilities of manufacturers, the minimum board thickness is 0.7 mm in theory, and here the thickness of laminate is 8 mil. Prepreg in the middle is optionally 1080/2116/3313/7628. A relatively thick prepreg is used preferably. The board thickness will be increased sequentially as the thickness of laminate is increased. The board thickness can be increased for optimization. However, the board thickness can also be reduced as well owing to a progress of the technologic level so as to comply with a requirement of a super thin design. A use of other similar low-cost dielectric materials will not be excluded.

3. Crosstalk Control Principle

Preferably, the two inner layers function as primary wiring layers in the four-layer board with mechanical vias. Due to the special laminated structure of the four-layer board with mechanical vias, the two primary wiring layers possibly have a short distance from each other and a long distance respectively from two surface layers. In order to control effectively the crosstalk between wirings at the two inner layers, the thickness of the two laminates shall be reduced if possible while increasing the thickness of the prepreg between the two laminates. The wirings at the two inner layers shall be kept away from each other if possible, and shall be perpendicular to each other if they cross each other. An important signal line may cross other line at an adjacent layer for strictly limited times.

4. Impedance Control Principle

Wirings are short in a mobile phone board and the consistency or continuity of impedance control on radio frequency wirings will be preferential over the resultant impedance control target value. In compliance with this principle, the consistency of a line width/an interlayer distance/a dielectric DK value/a copper thickness can be controlled so as to control impedance continuity indirectly. This method can ensure the consistency of the whole-board electric performances of the boards manufactured by different PCB manufacturers while ensuring impedance control. This will be advantageous to adjusting of circuit parameters, facilitate guaranteeing margins of various electric indexes and enable the board to operate more stably and reliably.

Only an impedance control method for a four-layer board with mechanical blind vias will be described herein. Impedance control on a four-layer through-via board without mechanical blind via is a mature technology, and detailed descriptions thereof will not be given.

Designs for laminated layers of a four-layer board with mechanical blind vias are as illustrated in FIGS. 12-15. Particularly, two double sided boards fabricated separately are stacked to be laminated, drilled and plated.

Due to the uniform design of impedance control in the four-layer board with mechanical blind vias, more direct impedance control can be enabled by controlling the line width/the interlayer distance. This can also reduce a workload of manufacturers for an impedance test and thus low the fabrication cost. This approach recommends that an impedance control patter can be fabricated at an auxiliary edge for board splicing of unit boards to act as a backup test pattern during debugging.

4.1 Analysis on Impedance Control Tolerance

A typical line width tolerance is +/−20%.

Typical board material thickness tolerance ranges for the four-layer HDI board with mechanical vias are illustrated as Table 7 below.

TABLE 7

| | Thickness H (mil) | | |
|---|---|---|---|
| | $H <= 4$ mil | $4$ mil $< H <= 8$ mil | $8$ mil $< H$ |
| Tolerance D (μm) | +/−15 | +/−25 | +/−50 |

1) Primary factors relevant to impedance control are the line width/the layer height/the dielectric constant/the copper thickness. A variation of the dielectric DK value/the copper thickness has little influence on the impedance value, resulting in a variation of approximately 1 ohm, and therefore the influence of the two factors can be negligible.

2) In view of the features of the fabrication process, the layer height is substantially reduced because basic materials are to be moved to fill vias and to fill copper-free areas in laminating. If the board material thickness exceeds the designed thickness, the excessive thickness shall be within the designed tolerance range. After via filling and copper-free area filling by laminating, the thickness of the excessively thick board material can be reduced. As a whole, the board material thickness will not reach the positive tolerance, and it is possible to consider only the negative tolerance range.

3) In view of the fabrication process, a resultant line width is always below the designed line width due to undercut, and therefore it is possible to consider only an influence of the line width taking the negative tolerance upon the target impedance value.

4) Typically, as can be seen from the above analysis, the line width becomes smaller, and the layer height becomes smaller as well. The smaller the line width is, the higher the impedance will be, and the smaller the layer thickness is, the lower the impedance will be, therefore, errors in two direction will have complementary influence upon the impedance. Thus, the maximum tolerance range of a single factor will give rise to maximum influence upon the impedance.

4.2 Micro Strip Structure and Impedance Calculation Conditions

Figure 16:
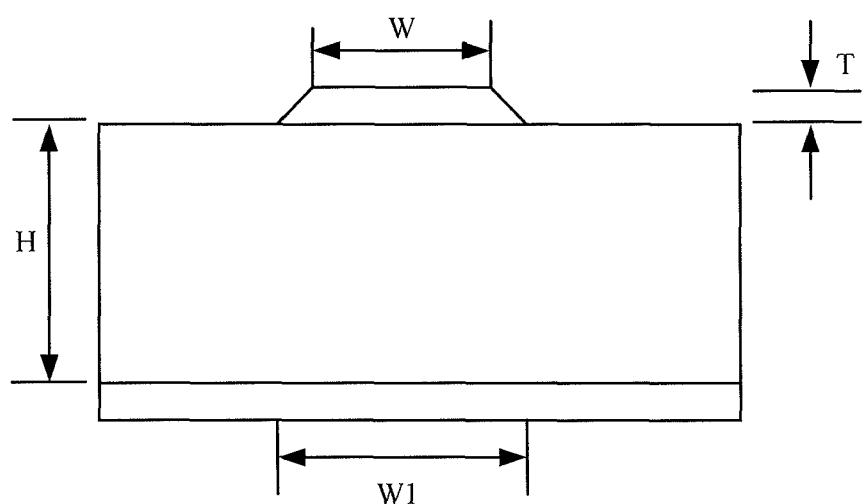
FIG. 16 is a schematic principle diagram of the structure of a micro strip of the four-layer board with mechanical blind vias.

With reference to FIG. 16 illustrating a schematic diagram of a micro strip structure of the four-layer HDI board with mechanical vias. The calculation tool is CITS25 VERSION 2004.

Designed values and control values for the impedance of a 50-ohm micro strip for the four-layer HDI board with mechanical vias are illustrated in Table 8 below for reference.

TABLE 8

| Laminate Height H (mil) | 8 | 8 | 12 | 12 |
|---|---|---|---|---|
| Line width W1 (mil) | 15.5 | 15.5 | 23.5 | 23.5 |
| Line width tolerance | +/−20% | +20/−15% | +/−20% | +20/−15% |
| Layer height tolerance (μm) | +/−25 | +/−25 | +/−25 | +/−25 |
| Target impedance and tolerance (ohm) | 50 +/− 7 | 50 +/− 5 | 50 +/− 7 | 50 +/− 5 |

Where, H denotes the interlayer height between the micro strip and a reference layer;
W denotes a width of the top of the micro strip;
W1 denotes a width of the bottom of the micro strip; and
T denotes a thickness of the micro strip.

4.3 Strip Structure and Impedance Calculation Condition

Figure 17:
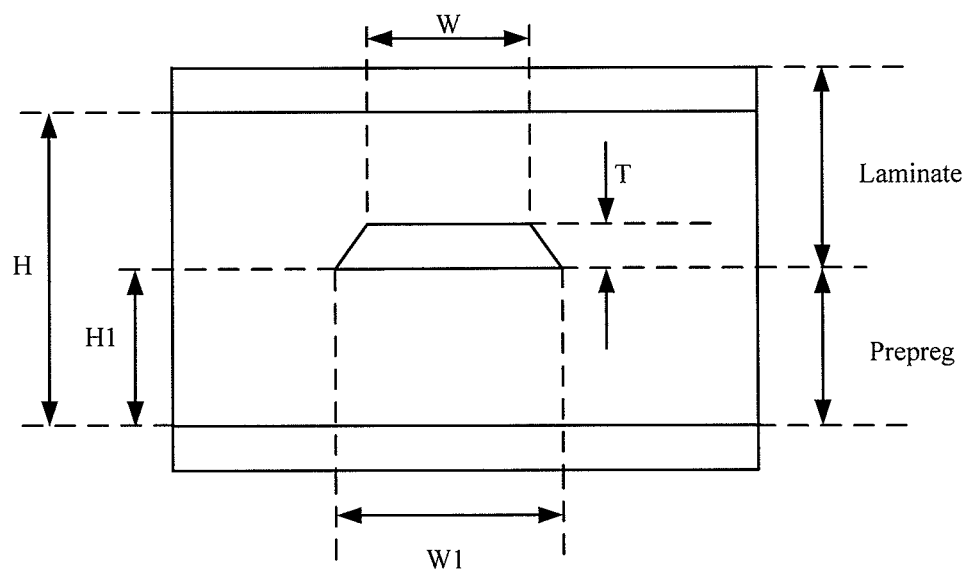
FIG. 17 is a schematic principle diagram of the structure of a strip of the four-layer board with mechanical blind vias.

With reference to FIG. 17 illustrating a schematic diagram of a strip structure of the four-layer HDI board with mechanical vias. The calculation tool is CITS25 VERSION 2004.

Designed values and control values for the impedance of a 50-ohm strip are illustrated in Table 9 below for reference.

TABLE 9

| Layer height H (mil) | 17.2 | 15.5 |
|---|---|---|
| Layer height of laminate (mil) | 8 | 8 |
| Thickness of prepreg H1 (mil) | 8 | 6.3 |
| Line width W1 (mil) | 7 | 5 |
| Line width tolerance | +/−20% | +/−20% |
| Layer height H tolerance (μm) | +/−50 | +/−50 |
| Target impedance and tolerance (ohm) | 50 +/− 5 | 50 +/− 5 |

Where: H denotes the interlayer height between reference layers;
H1 denotes an interlayer height between the strip and a lower reference layer;
W denotes a width of the top of the strip;
W1 denotes a width of the bottom of the strip; and
T denotes a thickness of the strip.

5. Reliability Analysis and Validation

Two laminates are used for the four-layer board with mechanical blind vias. Due to the copper sheet laminated over both surfaces of the laminates, the flatness of the laminates is far superior to that of the prepreg in the case of high temperature and high pressure. A thick laminate has better strength of anti-high temperature and anti-high pressure than a thin laminate. Therefore the flatness of the four-layer board with mechanical blind vias is superior to that of a conventional HDI structure (e.g. a 1+4+1 or 1+1+2+1+1 six-layer board with laser vias, which typically includes one laminate layer) and also has a better performance of anti-high temperature.

The above descriptions are illustrative of the printed circuit board design method according to the embodiments of the invention, and correspondingly, two printed circuit board structures are provided according to embodiments of the invention.

1. Four-layer HDI board with laser blind vias

With reference to FIG. 5, a schematic diagram of a four-layer HDI printed circuit board with laser blind vias according to an embodiment of the invention is shown.

The printed circuit board according to the embodiment of the invention includes four layers, including two outer surface layers, i.e., the first layer (layer 1) 10 and the fourth layer (layer 4) 40, and two inner layers, i.e., the second layer (layer 2) 20 and the third layer (layer 3) 30, and a dielectric material is laminated between each of the four layers and its adjacent layer. The printed circuit board further includes a blind via 50, a buried via 60 and a through via 70. It shall be noted that one of structure forms of the four-layer HDI printed circuit board with laser blind vias is illustrated here just by way of an example, but the invention will not be limited to this. The first layer (layer 1) 10 can also be referred to as the top layer, and the fourth layer (layer 4) 40 can also be referred to as the bottom layer. The dielectric material includes the prepreg, the laminate, etc., and the prepreg is typically FR4.

2. Four-layer HDI board with mechanical vias

With reference to FIG. 12, a schematic diagram of a four-layer HDI printed circuit board with mechanical blind vias according to an embodiment of the invention is shown.

The printed circuit board according to the embodiment of the invention includes four layers, including two outer surface layers, i.e., the first layer (layer 1) 10 and the fourth layer (layer 4) 40, and two inner layers, i.e., the second layer (layer 2) 20 and the third layer (layer 3) 30, and a dielectric material is laminated between each of the four layers and its adjacent layer. The printed circuit board further includes mechanical blind vias 50 and through vias 70. It shall be noted that one of structure forms of the four-layer PCB board with mechanical blind vias is illustrated here just by way of an example, but the invention will not be limited to this. The first layer (layer 1) 10 can also be referred to as the top layer, and the fourth layer (layer 4) 40 can also be referred to as the bottom layer. The dielectric material includes the prepreg, the laminate, etc., and the prepreg is typically FR4.

With reference to both FIGS. 5 and 12, the two inner layers, i.e., the second layer (layer 2) 20 and the third layer (layer 3) 30, are used for arranging signal lines, and the signal lines are wired in the inner layers on an area basis. Wirings in the two inner layers are divided into areas strictly by functions, including a radio frequency signal area and a digital signal area, both of which are arranged respectively within a shielding box/cavity. The area at adjacent layer corresponding to the wirings is arranged with a ground copper sheet with a large area or arranged vertically with few wiring.

The two surface layers, i.e., the first layer (layer 1) 10 and the fourth layer (layer 4) 40, are typically arranged with no wiring or with wirings as few as possible. When one of the outer surface layers acts as a keyboard arrangement side, the other acts as a device arrangement side.

Figure 18:
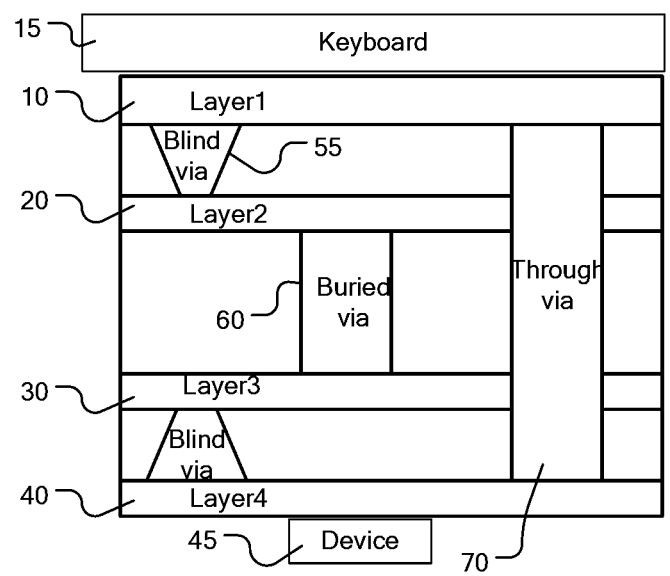
FIG. 18 is a schematic diagram of a four-layer hdi printed circuit board with laser blind vias which is used as the inventive mainboard of a terminal product according to the first embodiment.

As shown in FIG. 18, in the case that the first layer (layer 1) is the keyboard (15) arrangement side and the fourth layer (layer 1) 40 is the device (45) arrangement side, then the second layer (layer 2) 20 adjacent to the first layer (layer 1) 10 is used for arranging radio frequency signal lines, power signal lines, clock signal lines and audio signal lines.

The master power line is arranged along a board edge at the inner layer adjacent to the keyboard arrangement side, two adjacent layers are arranged with ground copper sheets with a large area, and the ground copper sheets at different layers are in good connectivity to each other. Other power lines avoid overlapping vertically with the keyboard PAD. The wired audio signal lines correspond to a portion at the keyboard arrangement side that is arranged with a ground copper with a large area, and are kept away from the keypad PAD, and a portion of the other inner layer adjacent thereto is a complete ground copper sheet. The wired clock signal lines corresponds to a portion at the keyboard arrangement side which is arranged with a ground copper with a large area, and are kept away from the keypad PAD, and a portion of the other inner layer adjacent thereto is a complete ground copper sheet.

The third layer (layer 3) 30 adjacent to the fourth layer (layer 4) 40 is used for arranging data buses and multimedia signal lines. Radio frequency signal lines can also be arranged at this layer.

The data buses are wired at the same layer, and a surface-layer short line is used for layer switching in the case of a cross of the data buses. Generally, existing data buses are distinguished by neither categories nor clusters, but in the printed circuit boards according to the embodiments of the invention, the data buses are clustered by categories and wired by clusters, and clusters are isolated from each other through a ground line, thereby reducing crosstalk. The ground line for isolation is interconnected well with the ground having a large area and a ground at other layers. The multimedia signal lines are also wired at the same layer, clustered by categories and wired by clusters, and clusters are isolated from each other through a ground line.

In an existing six-layer HID board, one of inner layers can function as a primary ground, thus providing a complete return current ground with a large area, and therefore crosstalk between signals can be reduced. In contrast, a four-layer HDI board includes only two inner layers, and it is not feasible to have one of the inner layers acting as a primary ground, in other words, no complete primary ground at any layer can be provided. Consequently, a major problem of the four-layer board is an incomplete copper sheet of the primary ground, resulting in a discontinuous and incomplete return current path of high speed signals, so that signal crosstalk occurs likely. In the printed circuit boards according to the embodiment of the invention, the two outer surface layers, i.e., the first layer (layer 1) 10 and the fourth layer (layer 4) 40, are arranged with wirings as few as possible and are interconnected well through the through vias to act together as a primary reference ground which provides the two inner layers, i.e., the second layer (layer 2) 20 and the third layer (layer 3) 30 respectively with a primary return current ground, so that a complete return current path can be provided and signal crosstalk can be reduced. After wiring is completed, all blank areas are spread with ground, and patches of the ground copper sheet are interconnected well with the large-area ground copper sheet through sufficient ground vias.

As can be seen from the above, in the design solutions for layer reduction of a printed circuit board provided in the embodiments of the invention, signal lines are wired on an area basis at the inner layers adjacent to the outer surface layers; the outer surface layers are arranged with no wiring or few wirings, and are interconnected as a primary ground through the through vias; and the parameters of the line width and the layer height are set to control the target impedance value. The two inner layers primarily for wiring each are adjacent to the respective outer surface layers with a short interlayer distance therebetween, and the outer surface layers are arranged with no wiring or few wirings, therefore, the outer surface layers can be interconnected well through the through vias to provide a good return current ground for the respective adjacent inner layers, thereby reducing signal crosstalk. Further, the interlayer distance between the two inner layers is far above (>=2 times, preferably >=3 times) the distance from the two inner layers to the respective closest outer surface layers, as a result, according to deduction of the theory in spatial distribution of electromagnetic field, the crosstalk between wirings at the two inner layers arranged with such a distance can be far below the crosstalk between the wirings at the inner layers and those at the respective closest surface layer. In view of that the consistency (or referred to as continuity) of impedance control on the wired radio frequency signal lines is preferential over the resultant impedance control target value, the consistency of the line width and the layer height can be controlled so as to control the resultant impedance control target value indirectly. The resultant impedance control target value can be guaranteed if only the line width/the layer height reaches the designed parameter. Therefore, the design solutions for layer reduction of a printed circuit board according to the embodiments of the invention can control reasonably the signal crosstalk and enable impedance control, so as to reduce greatly the fabrication cost while maintaining essential performances of the original multi-layer printed circuit board.

Further, the data buses and the multimedia signal lines are clustered by categories and wired by clusters, and clusters are isolated from each other through a ground line, thereby further reducing signal crosstalk.

The printed circuit board and the design method thereof according to the embodiments of the invention have been described in details as above. The principle and embodiments of the invention have been set forth herein by way of two specific examples, and the descriptions of the embodiments are for better understanding of the method of the embodiments of the invention and the essential idea thereof. Also, modifications to the embodiments and applications of the invention can be made by those skilled in the art based on the idea of the embodiments of the invention. Accordingly, the descriptions shall not be construed as limiting the scope of the invention.

The invention claimed is:

1. A method of forming a printed circuit board comprising:
wiring signal lines on an area basis at a plurality of inner layers;
arranging each of a plurality of outer surface layers of the printed circuit board with a metal sheet, wherein each of the outer surface layers is disposed on an outer surface of the printed circuit board;
interconnecting the outer surface layers by at least one through via, so that the outer surface layers function as a primary ground; and
setting parameters of line width and layer height to control a target impedance value,
wherein the printed circuit board does not include a ground plane at any of the inner layers,
wherein an interlayer distance between two adjacent inner layers is at least twice a distance from each of the two adjacent inner layers to a corresponding one of the outer surface layers closest to the inner layer,
wherein the printed circuit board comprises at least three base plates and the outer surface layers and the inner layers are formed on surfaces of the base plates, and
wherein radio frequency signal lines, power signal lines, clock signal lines and audio signal lines are arranged at the inner layer adjacent to one of the outer surface layers, and the outer surface layer is on a keyboard arrangement side.

2. A method of forming a printed circuit board comprising:
wiring signal lines on an area basis at a plurality of inner layers;
arranging each of a plurality of outer surface layers of the printed circuit board with a metal sheet, wherein each of the outer surface layers is disposed on an outer surface of the printed circuit board;
interconnecting the outer surface layers by at least one through via, so that the outer surface layers function as a primary ground; and
setting parameters of line width and layer height to control a target impedance value,
wherein the printed circuit board does not include a ground plane at any of the inner layers,
wherein an interlayer distance between two adjacent inner layers is at least twice a distance from each of the two adjacent inner layers to a corresponding one of the outer surface layers closest to the inner layer, wherein the printed circuit board comprises at least three base plates and the outer surface layers and the inner layers are formed on surfaces of the base plates, and wherein radio frequency signal lines, data buses and multimedia signal lines are arranged at the inner layer adjacent to one of the outer surface layers, and the outer surface layer is on a device arrangement side.

3. The method of forming a printed circuit board according to claim 2, wherein:

the data buses and the multimedia signal lines are clustered by categories and wired by clusters.

* * * * *